(12) United States Patent
Yook et al.

(10) Patent No.: US 11,538,770 B2
(45) Date of Patent: Dec. 27, 2022

(54) SEMICONDUCTOR PACKAGE INCLUDING PASSIVE DEVICE EMBEDDED THEREIN AND METHOD OF MANUFACTURING THE SAME

(71) Applicant: Korea Electronics Technology Institute, Seongnam-si (KR)

(72) Inventors: Jong Min Yook, Seongnam-si (KR); Jun Chul Kim, Seongnam-si (KR); Dong Su Kim, Seongnam-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 59 days.

(21) Appl. No.: 16/878,727

(22) Filed: May 20, 2020

(65) Prior Publication Data

US 2020/0373256 A1 Nov. 26, 2020

(30) Foreign Application Priority Data

May 22, 2019 (KR) ........................ 10-2019-0060244

(51) Int. Cl.
*H01L 23/64* (2006.01)
*H01L 49/02* (2006.01)
*H01L 23/00* (2006.01)

(52) U.S. Cl.
CPC ............ *H01L 23/642* (2013.01); *H01L 24/05* (2013.01); *H01L 28/60* (2013.01)

(58) Field of Classification Search
CPC ....... H01L 23/642; H01L 28/60; H01L 24/05; H01L 24/96; H01L 2224/96;

(Continued)

(56) References Cited

U.S. PATENT DOCUMENTS

| 2011/0180899 | A1 | 7/2011 | Hiraga | |
| 2019/0035758 | A1* | 1/2019 | Hwang | ............... H01L 24/24 |
| 2020/0027864 | A1* | 1/2020 | Kim | .................. H01L 24/24 |

FOREIGN PATENT DOCUMENTS

| KR | 10-2013-0011171 A | 1/2013 |
| KR | 10-2013-0075552 A | 7/2013 |

OTHER PUBLICATIONS

Korean Office Action dated Jul. 8, 2021, in counterpart Korean Patent Application No. 10-2019-0060244 (3 pages in English and 5 pages in Korean).

* cited by examiner

*Primary Examiner* — Thanh T Nguyen
(74) *Attorney, Agent, or Firm* — NSIP Law

(57) ABSTRACT

A semiconductor package includes a semiconductor chip including an electrode pad formed on the top surface thereof, a passive device embedded in the semiconductor package, the passive device having no functional electrode on the top surface thereof, a cover layer covering the semiconductor chip and the passive device, and at least one electrode pattern formed on the cover layer to transmit electrical signals. The cover layer includes at least one first opening formed to expose a region in which the functional electrode is to be formed. The electrode pattern includes a functional electrode portion formed in a region in which the functional electrode of the passive device is to be formed through the first opening. In the process of forming the electrode pattern, a functional electrode of the passive device is formed together therewith, thereby eliminating a separate step of manufacturing a functional electrode and thus reducing manufacturing costs.

8 Claims, 9 Drawing Sheets

(58) Field of Classification Search
CPC ..... H01L 2224/2518; H01L 2224/2505; H01L 24/25; H01L 2224/82005; H01L 24/19; H01L 24/82; H01L 2924/15153; H01L 2924/15157; H01L 24/24; H01L 24/20; H01L 2224/04105; H01L 2924/142; H01L 2224/24247; H01L 2224/24195; H01L 21/568; H01L 23/3107; H01L 25/16; H01L 23/528; H01L 24/06; H01L 23/485; H01L 25/0652; H01L 28/10

See application file for complete search history.

SEMICONDUCTOR PACKAGE INCLUDING PASSIVE DEVICE EMBEDDED THEREIN AND METHOD OF MANUFACTURING THE SAME

CROSS REFERENCE TO RELATED APPLICATION

The present application claims priority to Korean Patent Application No. 10-2019-0060244, filed May 22, 2019, the entire contents of which is incorporated herein for all purposes by this reference.

BACKGROUND OF THE INVENTION

Field of the Invention

The present invention relates to a semiconductor package including a passive device embedded therein and a method of manufacturing the same.

Description of the Related Art

In the process of packaging a semiconductor chip (IC), passive devices such as a resistor or a capacitor may be packaged together in the package. When wire bonding is used to electrically connect the semiconductor chip to the capacitor, physical shocks may be applied to the capacitor during wire bonding, thus leading to damage to an insulator or an upper electrode of the capacitor and consequent defects in the final product. Further, when wire bonding is used for parts that operate in a high-frequency region or a high-power region, there is a problem in that distortion of an electrical signal occurs. Therefore, there is the need for a solution to problems that may occur when a passive device and a semiconductor chip are packaged together.

RELATED ART DOCUMENTS

Patent Documents (Patent Document 1) US 2011-0180899 A1

SUMMARY OF THE INVENTION

Therefore, the present invention has been made in view of the above problems, and it is an object of the present invention to provide a semiconductor package including an integrated passive device (IPD) embedded therein, in which a metallic line provided for electrical connection is used as an upper electrode of the IPD.

It is another object of the present invention to provide a method of manufacturing a semiconductor package including an IPD embedded therein, in which, in the process of forming a metallic line for electrical connection, an upper electrode of the IPD is formed together therewith.

In accordance with an aspect of the present invention, the above and other objects can be accomplished by the provision of a semiconductor package including a semiconductor chip including an electrode pad formed on the top surface thereof, a passive device embedded in the semiconductor package, the passive device having no functional electrode on the top surface thereof, a cover layer covering the semiconductor chip and the passive device, and at least one electrode pattern formed on the cover layer to transmit an electrical signal. The cover layer may include at least one first opening formed therein to expose a region in which the functional electrode is to be formed. The electrode pattern may include a functional electrode portion formed in a region in which the functional electrode of the passive device is to be formed through the first opening.

The passive device may include one of a capacitor, an inductor, and a resistor. The functional electrode may be an upper electrode or a lower electrode of the capacitor, a part of a spiral pattern of the inductor, or a part of a resistance pattern of the resistor.

The cover layer may further include at least one second opening formed therein to expose a portion of the electrode pad of the semiconductor chip. The electrode pattern may further include a chip connection portion connected to the electrode pad through the second opening.

The semiconductor package may further include at least one signal transmission segment disposed so as to be spaced apart from a side surface of the semiconductor chip or the passive device in order to transmit an electrical signal from an upper side of the semiconductor package to a lower side thereof. The cover layer may cover the signal transmission segment, and may further include at least one third opening formed therein to expose the signal transmission segment. The electrode pattern may further include at least one segment connection portion connected to the signal transmission segment through the third opening.

The semiconductor package may further include a first lower pad formed of a material having electrical conductivity on the bottom surface of the signal transmission segment so as to be in contact with an external circuit, and a second lower pad formed of a material having electrical conductivity on the bottom surface of the semiconductor chip or the bottom surface of the passive device so as to be in contact with an external ground.

The passive device may be a capacitor including a body portion having electrical conductivity and an insulating layer formed of a material having electrical insulativity on at least a portion of the top surface of the body portion, the capacitor having no upper electrode on the insulating layer. The first opening in the cover layer may be formed to expose a region in which the upper electrode is to be formed. The functional electrode portion of the electrode pattern may be formed in a region in which the upper electrode is to be formed, and may function as the upper electrode of the capacitor.

The cover layer may further include a fourth opening formed therein to expose a portion of the top surface of the body portion on which the insulating layer is not formed. The semiconductor package may further include an electrode pattern including a sub-electrode portion connected to the body portion through the fourth opening to function as a lower electrode of the passive device, the electrode pattern being not provided with the functional electrode portion.

In accordance with another aspect of the present invention, there is provided a method of manufacturing a semiconductor package including a passive device embedded therein, the method including a mounting step of placing a semiconductor chip and the passive device having no functional electrode, a covering step of forming a cover layer to cover the semiconductor chip and the passive device, the cover layer being formed to include at least one first opening formed therein to expose a region in which the functional electrode is to be formed, and an electrode pattern forming step of forming an electrode pattern on the cover layer using a material having electrical conductivity, the electrode pattern being formed to include a functional electrode portion formed in a region in which the functional electrode is to be formed through the first opening.

The method may further include, before the mounting step, a passive device preparation step of preparing the passive device including a body portion and an insulating layer formed on the body portion, the passive device having no upper electrode on the insulating layer.

The method may further include, before the mounting step, a base substrate preparation step of preparing a base substrate having electrical conductivity, the base substrate being formed to include a receiving portion having a circumference, at least a part of the circumference of the receiving portion being formed in a serpentine shape such that at least one protruding portion protrudes inwards from the circumference of the receiving portion. The method may further include, after the electrode pattern forming step, a cutting step of cutting a portion at which the protruding portion and the base substrate are connected to each other to form a signal transmission segment electrically insulated from the base substrate. In the covering step, at least one second opening may be further formed in the cover layer in order to expose a portion of an electrode pad of the semiconductor chip, or at least one third opening may be further formed in the cover layer in order to expose a portion of the protruding portion. In the electrode pattern forming step, a chip connection portion may be further formed so as to be connected to the electrode pad through the second opening, or a segment connection portion may be further formed so as to be connected to the protruding portion through the third opening.

The features and advantages of the present invention will be more clearly understood from the following detailed description taken in conjunction with the accompanying drawings.

It should be understood that the terms used in the specification and appended claims should not be construed as being limited to general and dictionary meanings, but should be construed based on meanings and concepts according to the spirit of the present invention on the basis of the principle that the inventor is permitted to define appropriate terms for the best explanation.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
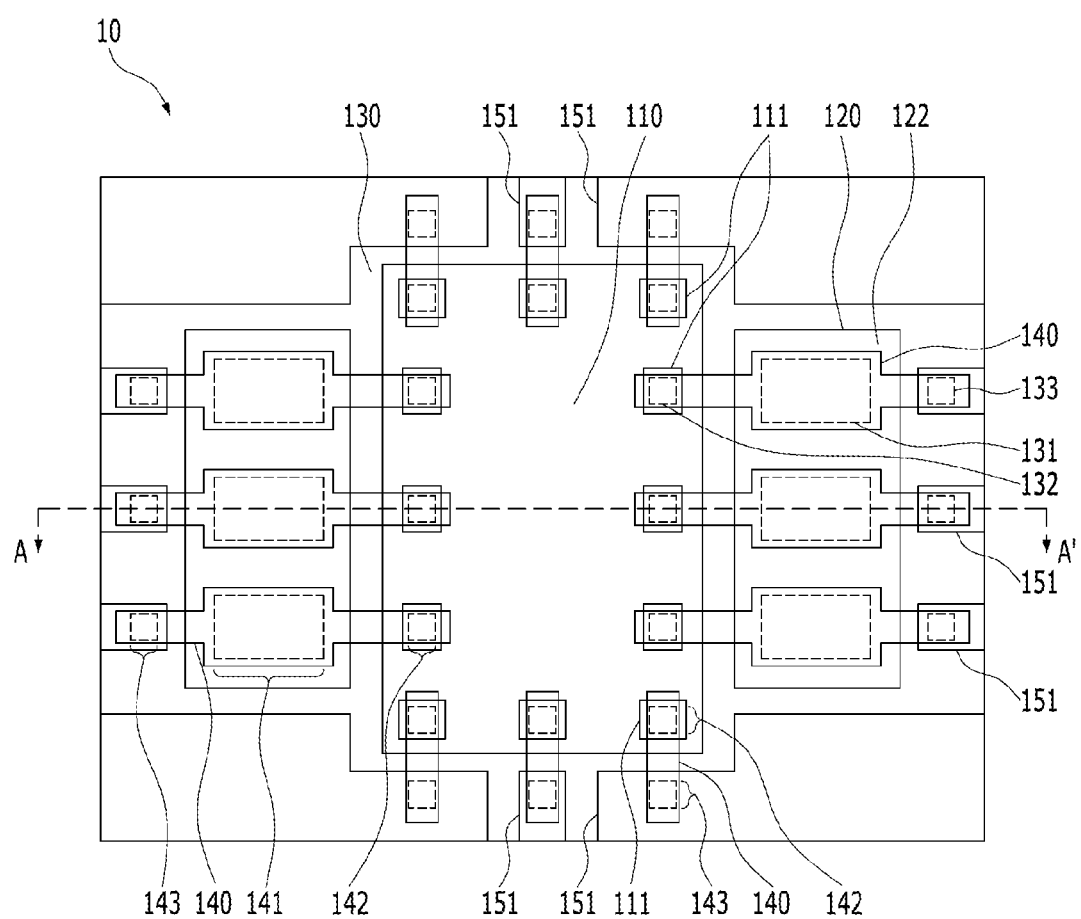
FIG. 1 is a plan view illustrating a semiconductor package including a passive device embedded therein according to an embodiment of the present invention.

Objects, specific advantages, and novel features of the present invention will be apparent from exemplary embodiments and the following detailed description in connection with the accompanying drawings. It should be noted that when reference numerals are assigned to the elements of the drawings, the same reference numeral is assigned to the same elements even when they are illustrated in different drawings. Furthermore, although the terms "one surface", "the other surface", "first", "second", etc. are used herein to describe various elements, these elements are not to be construed as being limited by these terms. These terms are generally only used to distinguish one element from another. In the following description of the present invention, a detailed description of known functions and configurations incorporated herein will be omitted when the same may obscure the subject matter of the present invention.

Hereinafter, an embodiment of the present invention will be described in detail with reference to the accompanying drawings.

Figure 2:
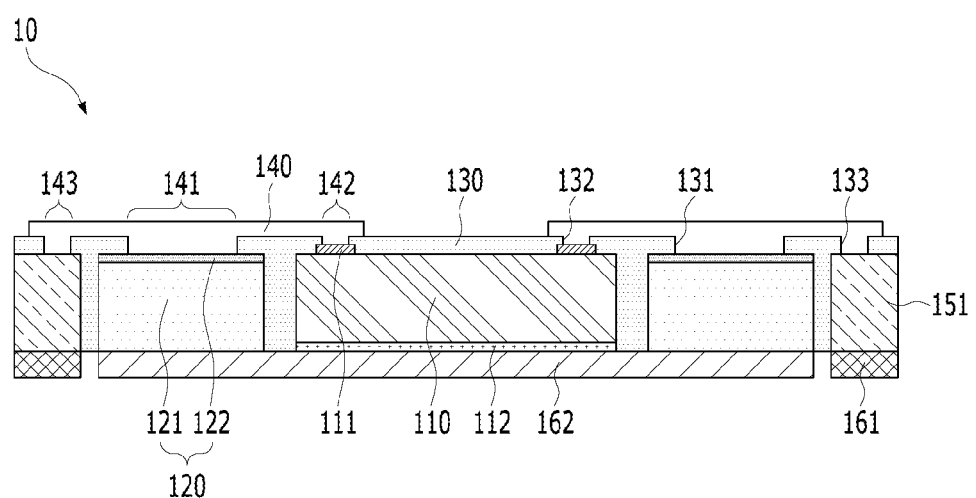
FIG. 2 is a cross-sectional view taken along line A-A' in FIG. 1.

FIG. 1 is a plan view illustrating a semiconductor package 10 including a passive device 120 embedded therein according to an embodiment of the present invention, and FIG. 2 is a cross-sectional view taken along line A-A' in FIG. 1.

As illustrated in FIGS. 1 and 2, the semiconductor package 10 including the passive device 120 embedded therein according to an embodiment of the present invention may include a semiconductor chip 110 having an electrode pad 111 formed on the top surface thereof, a passive device 120 having no functional electrode on the top surface thereof, a cover layer 130 covering the semiconductor chip 110 and the passive device 120, and at least one electrode pattern 140 formed on the cover layer 130 to transmit an electrical signal. The cover layer 130 may include at least one first opening 131 formed therein to expose a region in which a functional electrode is to be formed. The electrode pattern 140 may include a functional electrode portion 141 formed in a region in which the functional electrode of the passive device 120 is to be formed through the first opening 131.

The semiconductor chip 110 may operate in a high-frequency region or a high-power region. At least one electrode pad 111, configured to receive or output an electrical signal, may be formed on the top surface of the semiconductor chip 110. A ground pad 112, to which a ground GND is input, may be formed on the bottom surface of the semiconductor chip 110. At least one semiconductor chip 110 may be mounted in the semiconductor package.

The passive device 120 may include any one of a resistor, an inductor, and a capacitor. Alternatively, the passive device 120 may be an integrated passive device (IPD) 120, in which a resistor, an inductor, and a capacitor are integrated, a single-layer capacitor (SLC), a capacitor array, or the like. In an embodiment of the present invention, the passive device 120 mounted in the semiconductor package is an incomplete passive device 120, on which no functional electrode is formed.

A functional electrode is a component that is required in order for the passive device 120 to perform the function of the passive device 120. For example, a capacitor generally has an insulating layer 122 formed on a lower electrode and an upper electrode formed on the insulating layer 122 to perform the function of the capacitor. Here, the upper electrode or the lower electrode may be a functional electrode in an embodiment of the present invention. Alternatively, an inductor performs the function thereof using a spiral pattern thereof. Here, a part of the spiral pattern may be a functional electrode in an embodiment of the present invention. Alternatively, a resistor may perform the function thereof using a resistance pattern thereof. Here, a part of the resistance pattern may be a functional electrode in an embodiment of the present invention. In summary, the functional electrode may be an upper electrode or a lower electrode of a capacitor, a part of a spiral pattern of an inductor, or a part of a resistance pattern of a resistor. Therefore, according to an embodiment of the present invention, the passive device 120, which is packaged together with the semiconductor chip 110, may include a capacitor without an upper electrode, an inductor without a part of a spiral pattern, or a resistor without a part of a resistance pattern.

The cover layer 130 may be formed of a material having electrical insulativity, and may cover the semiconductor chip 110 and the passive device 120. The cover layer 130 may be formed of an organic lamination material, a photodefinable lamination resin, or the like. The cover layer 130 may be disposed in the space between the semiconductor chip 110 and the passive device 120 to fix the semiconductor chip 110 and the passive device 120. The cover layer 130 may be formed to cover the top surfaces of the semiconductor chip 110 and the passive device 120. The cover layer 130 may include at least one first opening 131 formed therein to expose a region in which a functional electrode is to be formed. For example, when the passive device 120 is a capacitor without an upper electrode, the first opening 131 may have the shape of a hole, which is formed by removing a portion of the cover layer 130 so as to expose a region in which an upper electrode is to be formed.

The electrode pattern 140 may be formed of an electrically conductive material in order to transmit an electrical signal, and may provide a contact point that is connected to an external circuit. The electrode pattern 140 may be formed on the cover layer 130. The electrode pattern 140 may include a functional electrode portion 141, which is formed in the region in which a functional electrode of the passive device 120 is to be formed through the first opening 131 in the cover layer 130. The functional electrode portion 141 of the electrode pattern 140 may be formed in a region in which an upper electrode of the passive device 120 is to be formed, and may function as an upper electrode of the passive device 120. Since the functional electrode portion 141 of the electrode pattern 140 is formed on the passive device 120, the passive device 120 may perform the function of the passive device 120. For example, when the passive device 120 is a capacitor without an upper electrode, since the functional electrode portion 141 is formed on the insulating layer 122 of the passive device 120, the functional electrode portion 141 functions as an upper electrode. As a result, the passive device 120 may perform the function of a capacitor.

The shape of the first opening 131 formed in the cover layer 130 may vary depending on the shape of the functional electrode of the passive device 120. For example, when the passive device 120 is a capacitor, because the area of the upper electrode of the capacitor is a factor that has an influence on the capacitance of the capacitor, the shape of the first opening 131 may be determined depending on the shape of the upper electrode, which is designed to form a capacitor having a specific capacitance. In other words, it is possible to adjust the capacitance of the capacitor by varying the shape of the first opening 131, whereby the capacitance of the capacitor may be determined in the packaging process.

For example, As illustrated in FIGS. 1 and 2, the passive device 120 may be a capacitor, which includes a body portion 121 having electrical conductivity and an insulating layer 122 formed of a material having electrical insulativity on at least a portion of the top surface of the body portion 121, and does not have an upper electrode on the insulating layer 122. In this case, the first opening 131 in the cover layer 130 may be formed to expose a region in which an upper electrode is to be formed, and the functional electrode portion 141 of the electrode pattern 140 may be formed in a region in which an upper electrode is to be formed, and may thus function as an upper electrode of the capacitor. The body portion 121 may be formed by doping a dopant in a silicon material at a high concentration to realize electrical conductivity, may be formed of a compound semiconductor to realize electrical conductivity, or may be formed of a metal material having electrical conductivity, thereby functioning as the lower electrode of the capacitor. The insulating layer 122 formed on the body portion 121 may function as an insulator of the capacitor. The functional electrode portion 141 of the electrode pattern 140 formed on the insulating layer 122 may function as an upper electrode of the capacitor. Therefore, in this embodiment, the passive device 120 may function as a capacitor in a manner such that the body portion 121, the insulating layer 122, and the functional electrode portion 141 function as a lower electrode, an insulator, and an upper electrode, respectively.

In the semiconductor package 10 including the passive device 120 embedded therein according to an embodiment of the present invention described above, a portion of the electrode pattern 140 provided for electrical connection in the semiconductor package is used as a functional electrode of the embedded passive device 120. Thus, it is possible to eliminate a step of manufacturing a functional electrode in the process of manufacturing the passive device 120, thereby reducing the cost of manufacturing the passive device 120.

The passive device 120 according to an embodiment of the present invention described above may be formed of any of various materials. Conventionally, when the semiconductor chip 110 and the passive device 120 are packaged together using wire bonding, shocks are applied to the passive device 120 in the process of connecting a wire to the passive device 120, thus causing damage to the passive device 120. In order to solve this problem, the upper electrode of the capacitor needs to be formed to be thick, or the insulating layer 122 needs to be formed of a material having high shock resistance so as to withstand the shocks applied thereto in the process of wire connection. Further, in order to improve electrical contact between the upper electrode and the wire, a high-cost material such as gold (Au) needs to be used.

In contrast, according to an embodiment of the present invention, since wire bonding is not used, no shocks are applied to the passive device 120. Thus, even when the passive device 120 is formed of any of various materials, the passive device 120 is less likely to be damaged, thus lowering the defect rate. Further, the insulating layer 122 may be formed to be thin, or may be formed of any of various materials that have a high dielectric constant but cannot be used in the conventional art due to the low strength thereof, thereby improving the performance of the capacitor. Furthermore, in the process of forming the electrode pattern 140, the functional electrode portion 141 is formed together therewith on the passive device 120. Thus, it is not necessary to form a thick upper electrode or to form an upper electrode using a high-cost material such as Au, thereby reducing costs.

As illustrated in FIGS. 1 and 2, in the semiconductor package 10 including the passive device 120 embedded therein according to an embodiment of the present invention, the cover layer 130 may further include at least one second opening 132 formed therein to expose a portion of the electrode pad 111 of the semiconductor chip 110. The electrode pattern 140 may further include a chip connection portion 142, which is connected to the electrode pad 111 through the second opening 132.

The electrode pattern 140 may include either the functional connection portion or the chip connection portion 142, or may include both the functional connection portion and the chip connection portion 142. The electrode pattern 140 including the functional connection portion may be connected to the passive device 120 to transmit an electrical signal that is input to or output from the passive device 120. The electrode pattern 140 including the chip connection portion 142 may be connected to the electrode pad 111 of the semiconductor chip 110 to transmit an electrical signal that is input to or output from the semiconductor chip 110. The electrode pattern 140 including both the functional connection portion and the chip connection portion 142 may connect an electrode terminal of the semiconductor chip 110 to the passive device 120 in order to transmit electrical signals that are input to or output from the semiconductor chip 110 and the passive device 120.

As illustrated in FIGS. 1 and 2, the semiconductor package 10 including the passive device 120 embedded therein according to an embodiment of the present invention may further include at least one signal transmission segment 151, which is disposed so as to be spaced apart from the side surface of the semiconductor chip 110 or the passive device 120 in order to transmit an electrical signal from the upper side of the semiconductor package to the lower side thereof. The cover layer 130 may cover the signal transmission segment 151, and may further include at least one third opening 133 formed therein to expose the signal transmission segment 151. The electrode pattern 140 may further include at least one segment connection portion 143, which is connected to the signal transmission segment 151 through the third opening 133.

The signal transmission segment 151 may be spaced apart from the side surface of the semiconductor chip 110 or the passive device 120. The signal transmission segment 151 may be provided in a number necessary to transmit an electrical signal. The signal transmission segment 151 may be formed of a material having electrical conductivity in order to transmit an electrical signal from the top surface of the semiconductor package to the bottom surface thereof. For example, the signal transmission segment 151 may be formed of a metal material such as copper (Cu) or aluminum (Al) or an alloy material having electrical conductivity. The signal transmission segment 151 may be formed using a portion of a base substrate 200, which accommodates the semiconductor chip 110 or the passive device 120 therein.

The electrode pattern 140 may include one of the functional connection portion, the chip connection portion 142, and the segment connection portion 143, may include both the functional connection portion and the chip connection portion 142, may include both the functional connection portion and the segment connection portion 143, or may include both the chip connection portion 142 and the segment connection portion 143. An electrode pattern 140 that includes the segment connection portion 143 and further includes the chip connection portion 142 or the functional connection portion may transmit an electrical signal that is input to or output from the semiconductor chip 110 or the passive device 120. The electrical signal transmitted to the top surface of the signal transmission segment 151 by the electrode pattern 140 may be transmitted to the bottom surface of the signal transmission segment 151, and may be input or output through the bottom surface of the signal transmission segment 151.

The signal transmission segment 151 may be electrically connected to the electrode pattern 140 and to an external circuit in order to transmit an electrical signal, or may be connected to a ground of an external circuit to function as a ground. The signal transmission segment 151 may not be connected to the electrode pattern 140 or to an external circuit, and may function to physically support the semiconductor package.

The semiconductor package 10 including the passive device 120 embedded therein according to an embodiment of the present invention may further include a protective layer, which is formed on the cover layer 130 in order to cover the electrode pattern 140 to protect the same.

Conventionally, in order to transmit an electrical signal that is input to or output from the semiconductor chip 110 or to dissipate heat generated in the semiconductor chip 110, a via hole is formed so as to penetrate the semiconductor package in an upward-downward direction. When the semiconductor package is formed to have a large height in order to charge metal into the via hole, the via hole needs to be formed to have a large diameter. If the diameter of the via hole is small, the semiconductor package is increasingly likely to become defective when metal is charged in the via hole. As such, the via hole is a factor that increases the size of the package. Further, the process of forming the via hole is cost-consuming.

In contrast, in the semiconductor package 10 including the passive device 120 embedded therein according to an embodiment of the present invention described above, the signal transmission segment 151, which is formed using a portion of base substrate 200, which is formed of a metal material, is used as an electrical signal transmission path connecting the upper side of the semiconductor package and the lower side thereof to each other. Thus, it is not necessary to form a via hole penetrating the semiconductor package in an upward-downward direction, thus reducing the size of the semiconductor package and lowering the defect rate.

As illustrated in FIGS. 1 and 2, the semiconductor package 10 including the passive device 120 embedded therein according to an embodiment of the present invention may further include a first lower pad 161, which is formed of a material having electrical conductivity on the bottom surface of the signal transmission segment 151 so as to be in contact with an external circuit, and a second lower pad 162, which is formed of a material having electrical conductivity on the bottom surface of the semiconductor chip 110 or the bottom surface of the passive device 120 so as to be in contact with an external ground.

The first lower pad 161 or the second lower pad 162 may function as a component for electrical or physical connection to an external circuit. The first lower pad 161 or the second lower pad 162 may include electrically conductive metal such as copper (Cu) or aluminum (Al) or an electrically conductive alloy. The first lower pad 161 may be formed on the bottom surface of the signal transmission segment 151 to transmit an electrical signal that is input or output through the signal transmission segment 151 to an external circuit. The second lower pad 162 may be connected to the bottom surface of the ground pad 112, which is formed on the bottom surface of the semiconductor chip 110, or to the bottom surface of the passive device 120 in order to connect the external ground to the semiconductor chip 110 or to the passive device 120. The first lower pad 161 and the second lower pad 162 may be spaced apart from each other so as to be electrically insulated from each other, and may be formed to have a large area in order to transfer the heat generated in the semiconductor chip 110 or the passive device 120 to the external circuit.

Figure 3:
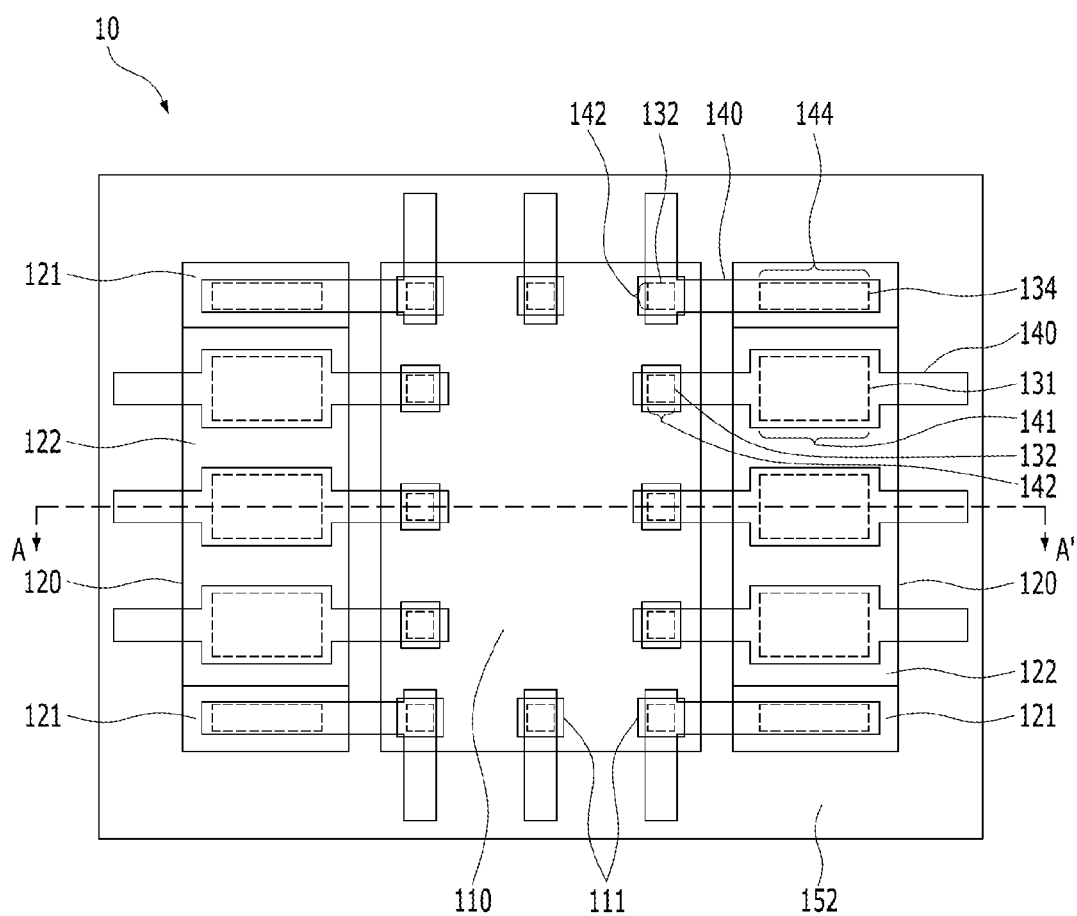
FIG. 3 is a plan view of a semiconductor package including a fan-out-type passive device embedded therein according to an embodiment of the present invention.
Figure 4:
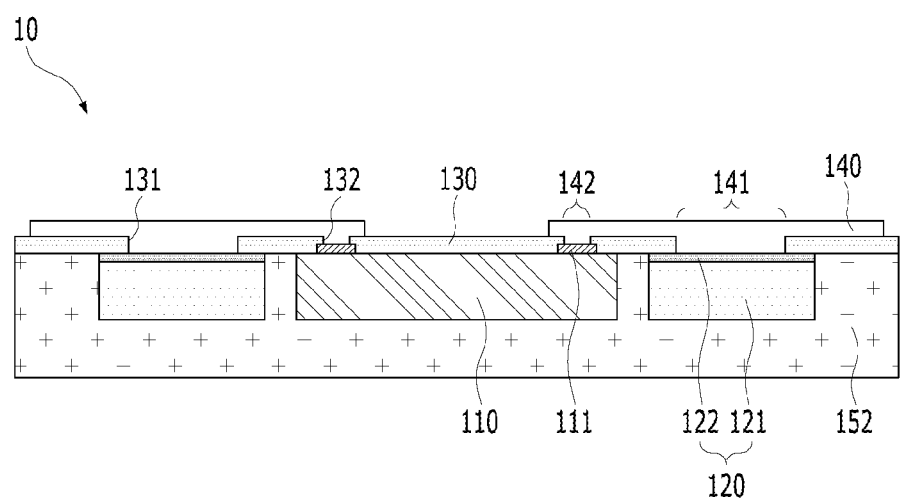
FIG. 4 is a cross-sectional view taken along line A-A' in FIG. 3.

FIG. 3 is a plan view of a semiconductor package 10 including a fan-out-type passive device 120 embedded therein according to an embodiment of the present invention, and FIG. 4 is a cross-sectional view taken along line A-A' in FIG. 3.

As illustrated in FIGS. 3 and 4, the semiconductor package 10 including the passive device 120 embedded therein according to an embodiment of the present invention may include a semiconductor chip 110, a passive device 120 having no functional electrode, a cover layer 130 having a first opening 131 formed therein, and an electrode pattern 140 including a functional electrode portion 141, and may further include a molding part 152 formed so as to surround the semiconductor chip 110 and the passive device 120 to protect the same. The electrode pattern 140 and the cover layer 130 may form a redistribution layer. The molding part 152 may be formed so as to fill the space between the semiconductor chip 110 and the passive device 120 and to cover the lower portions thereof. The molding part 152 may be formed of a material having electrical insulativity. For example, the molding part 152 may be formed of an epoxy molding compound or the like.

As illustrated in FIG. 4, when the back and side surfaces of the semiconductor chip 110 or the passive device 120 are surrounded by the molding part 152, a ground may not be connected to the bottom surface of the semiconductor chip 110 or the passive device 120. In this case, it is required to provide a ground for the passive device 120 to the top surface of the semiconductor package.

In the semiconductor package 10 including the passive device 120 embedded therein according to an embodiment of the present invention, the passive device 120 may be a capacitor, which includes a body portion 121 having electrical conductivity and an insulating layer 122 formed of a material having electrical insulativity on at least a portion of the top surface of the body portion 121, and does not have an upper electrode on the insulating layer 122. In this case, the first opening 131 in the cover layer 130 may be formed to expose a region in which an upper electrode is to be formed, and the functional electrode portion 141 of the electrode pattern 140 may be formed in a region in which an upper electrode is to be formed, and may thus function as an upper electrode of the capacitor.

In this case, the cover layer 130 may further include a fourth opening 134 formed therein to expose the portion of the top surface of the body portion 121 on which the insulating layer 122 is not formed. The semiconductor package 10 including the passive device 120 embedded therein according to an embodiment of the present invention may further include an electrode pattern 140, which includes a sub-electrode portion 144 connected to the body portion 121 through the fourth opening 134 to function as a lower electrode of the passive device 120 and does not include a functional electrode portion 141.

The fourth opening 134 in the cover layer 130 may be formed to expose a region in which electrodes other than the functional electrode are to be formed, whereby the electrode pattern 140 may form the sub-electrode portion 144, other than the functional electrode that is required by the passive device 120. For example, when the passive device 120 is a capacitor, the third opening 133 may be formed to expose a region in which an upper electrode is to be formed, and the fourth opening 134 may be formed to expose the body portion 121, which functions as a lower electrode. Accordingly, the sub-electrode portion 144 of the electrode pattern 140, which is connected to the body portion 121 through the fourth opening 134, may provide an electrical connection to a lower electrode of the capacitor on the top surface of the semiconductor package.

When the passive device 120 is a thin-film capacitor, in which a lower electrode is formed on the body portion 121, an insulating layer 122 is formed to cover a portion of the lower electrode, and an upper electrode is not formed on the insulating layer 122, the third opening 133 in the cover layer 130 may be formed to expose the region of the top surface of the insulating layer 122 in which an upper electrode is to be formed, and the fourth opening 134 in the cover layer 130 may be formed to expose the portion of the lower electrode on which the insulating layer 122 is not formed. Accordingly, the portion of the electrode pattern 140 that is formed through the third opening 133 may function as an upper electrode of the capacitor, and the portion of the electrode pattern 140 that is formed through the fourth opening 134 may provide electrical contact with the lower electrode of the capacitor.

The semiconductor package including the fan-out-type passive device 120 according to an embodiment of the present invention described above may simultaneously provide electrical contact for signal transmission and electrical contact for a ground on the top surface of the semiconductor package. The embodiments of the present invention illustrated in FIGS. 1 to 4, in which a functional electrode of the passive device 120 is not formed and in which the electrode pattern 140 is formed so as to function as a functional electrode of the passive device 120 in the process of packaging the passive device 120 together with the semiconductor chip 110, may be applied to various other packaging methods.

FIGS. 5A, 5B, 6A, 6B, 7A, 7B, 8A, 8B, 9A and 9B are views illustrating respective steps of a method of manufacturing a semiconductor package 10 including a passive device 120 embedded therein according to an embodiment of the present invention.

A method of manufacturing a semiconductor package 10 including a passive device 120 embedded therein according to an embodiment of the present invention may include a mounting step S30 of placing a semiconductor chip 110 and a passive device 120 not having a functional electrode, a covering step S40 of forming a cover layer 130 to cover the semiconductor chip 110 and the passive device 120, the cover layer 130 being formed to include at least one first opening 131 formed therein to expose a region in which a functional electrode is to be formed, and an electrode pattern forming step S50 of forming an electrode pattern 140 on the cover layer 130 using a material having electrical conductivity, the electrode pattern 140 being formed to include a functional electrode portion 141 formed in a region in which the functional electrode is to be formed through the first opening 131. The mounting step S30, the covering step S40, and the electrode pattern forming step S50 may be commonly applied to various wafer level packaging methods. It is to be understood that, even when another step, such as a molding step of forming a molding part 152, is added between the respective steps, the technical solution of the present invention is maintained without change.

Hereinafter, the steps of the method of manufacturing the semiconductor package 10 including the passive device 120 embedded therein according to an embodiment of the present invention will be sequentially described with reference to the drawings.

Figure 5A:
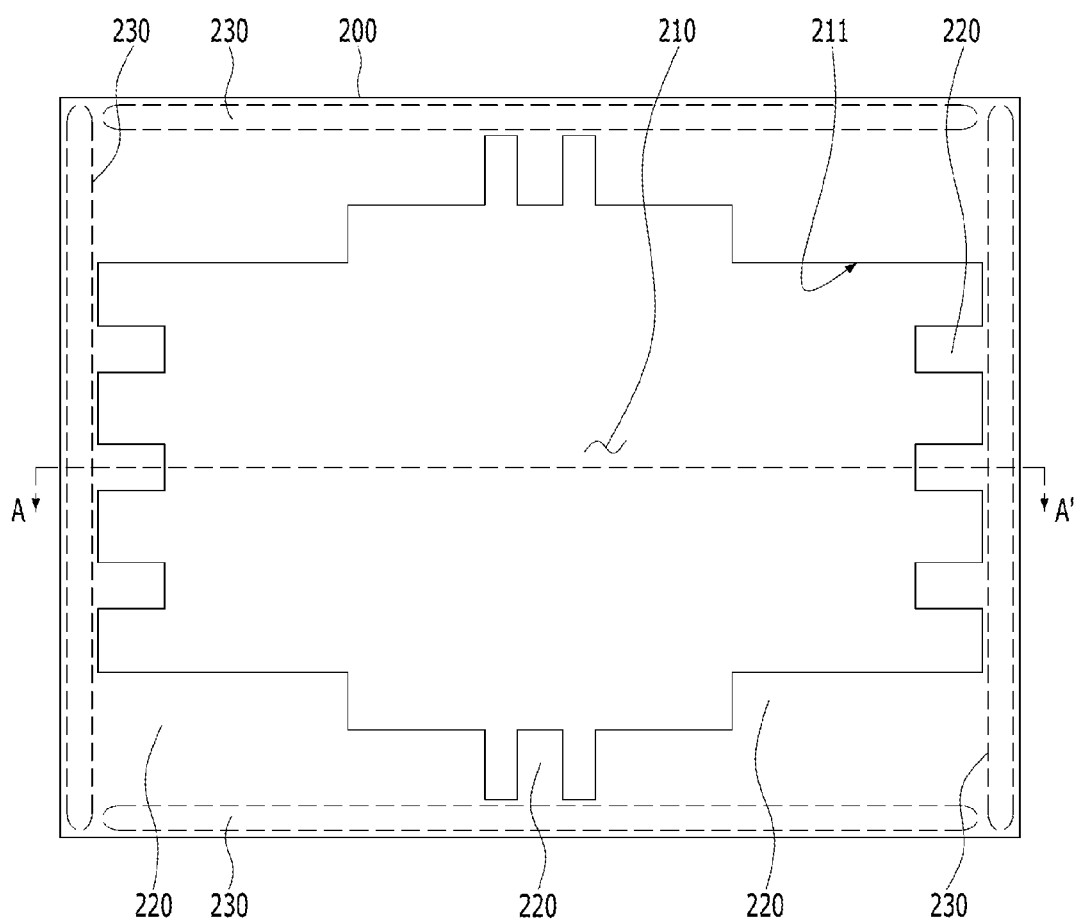
FIGS. 5A, 5B, 6A, 6B, 7A, 7B, 8A, 8B, 9A and 9B are views illustrating respective steps of a method of manufacturing a semiconductor package including a passive device embedded therein according to an embodiment of the present invention.
Figure 5B:
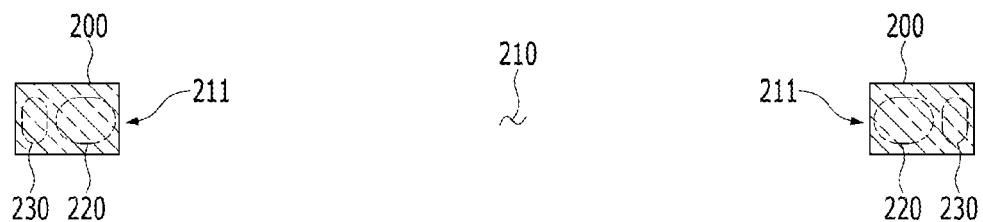

FIGS. 5A and 5B are a view illustrating a step of preparing a base substrate 200 in the method of manufacturing the semiconductor package 10 including the passive device 120 embedded therein according to an embodiment of the present invention. FIG. 5A is a plan view of the base substrate 200, and FIG. 5B is a cross-sectional view taken along line A-A' in FIG. 5A.

As illustrated in FIGS. 5A and 5B, the method of manufacturing the semiconductor package 10 including the passive device 120 embedded therein according to an embodiment of the present invention may further include, before the mounting step S30, a base substrate preparation step S10 of preparing a base substrate 200 having electrical conductivity, the base substrate 200 being formed to include a receiving portion 210 of which at least a part of a circumference is formed in a serpentine shape such that at least one protruding portion 220 protrudes inwards from the circumference of the receiving portion 210.

As illustrated in FIG. 5A, in the base substrate preparation step S10, the receiving portion 210 may be formed in a predetermined pattern in the base substrate 200, which is formed of a metal material, using a laser drilling method, an etching method, or the like. As illustrated in FIG. 5B, the receiving portion 210 may be formed so as to penetrate the top surface and the bottom surface of the base substrate 200. At least one receiving portion 210 may be formed in the base substrate 200. At least one receiving portion 210 may be formed in a single semiconductor package as needed. A plurality of receiving portions 210 may be formed in an array in the base substrate 200, and thus a plurality of semiconductor packages may be manufactured at the same time.

As illustrated in FIG. 5A, the receiving portion 210 may be formed to have an area large enough to receive the semiconductor chip 110 and the passive device 120 therein. The circumference 211 of the receiving portion 210 may have a serpentine shape such that at least one protruding portion 220 protrudes therefrom toward the semiconductor chip 110 or the passive device 120, i.e. in the inward direction of the receiving portion 210. The protruding portion 220 is a portion to be formed as a signal transmission segment 151 of the semiconductor package. The protruding portion 220 may be connected at one end thereof to a support portion 230 of the base substrate 200. The protruding portion 220 may be provided in a number corresponding to the number of paths necessary for transmission of electrical signals. The protruding portion 220 may be formed so as to face an electrode pad 111 of the semiconductor chip 110. A plurality of protruding portions 220 may be formed so as to be spaced apart from each other by a predetermined interval.

A plurality of receiving portions 210 may be formed so as to be spaced apart from each other by a predetermined interval. The portion of the base substrate 200 between adjacent receiving portions 210 may be referred to as a support portion 230 of the base substrate 200. The support portion 230 of the base substrate 200 may be connected to the protruding portion 220 to support the same. The concrete shape of the circumference 211 of the receiving portion 210 may vary depending on the semiconductor chip 110 or the passive device 120. The shape of the receiving portion 210 according to an embodiment of the present invention is not limited to any specific form, so long as at least a portion of the base substrate 200, specifically at least a portion of the circumference of the receiving portion 210, protrudes in the inward direction of the receiving portion 210 and the protruding portion is used as a signal transmission segment 151.

Figure 6A:
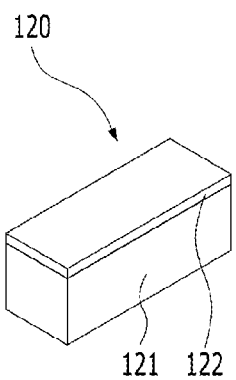
Figure 6B:
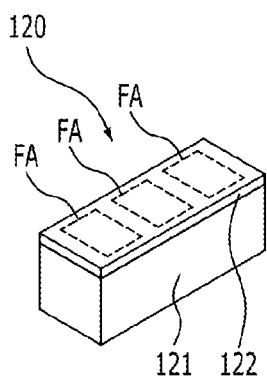

FIGS. 6A and 6B are a view illustrating a step of preparing the passive device 120 in the method of manufacturing the semiconductor package 10 including the passive device 120 embedded therein according to an embodiment of the present invention. FIG. 6A is a perspective view illustrating the passive device 120 without a functional electrode, and FIG. 6B is a perspective view indicating the position in the passive device 120 at which a functional electrode is to be formed using dotted lines.

The method of manufacturing the semiconductor package 10 including the passive device 120 embedded therein according to an embodiment of the present invention may further include, before the mounting step S30, a passive device preparation step S20 of preparing a passive device 120 including a body portion 121 and an insulating layer 122 formed on the body portion 121 and not including an upper electrode on the insulating layer 122. The body portion 121 may be formed by doping a dopant in silicon at a high concentration, or may be formed of metal. The insulating layer 122 may be formed on the top surface of the body portion 121. The insulating layer 122 may be formed of a material such as ceramic or silicon oxide, or may be formed by performing an anodizing process on the body portion 121, which is formed of a metal material such as aluminum (Al) or tantalum (Ta), to oxidize the top surface of the body portion 121. The insulating layer 122 formed on the top surface of the body portion 121 may be cut to a predetermined size, thereby forming an incomplete passive device 120, in which a functional electrode is not formed, as illustrated in FIG. 6A. At this time, as indicated by the dotted lines in FIG. 6B, a region FA in which a functional electrode is to be formed may be determined depending on the design requirements of the capacitor or the capacitance of the capacitor required for packaging. For example, at least one region FA in which a functional electrode is to be formed may be provided at one incomplete passive device 120.

Figure 7A:
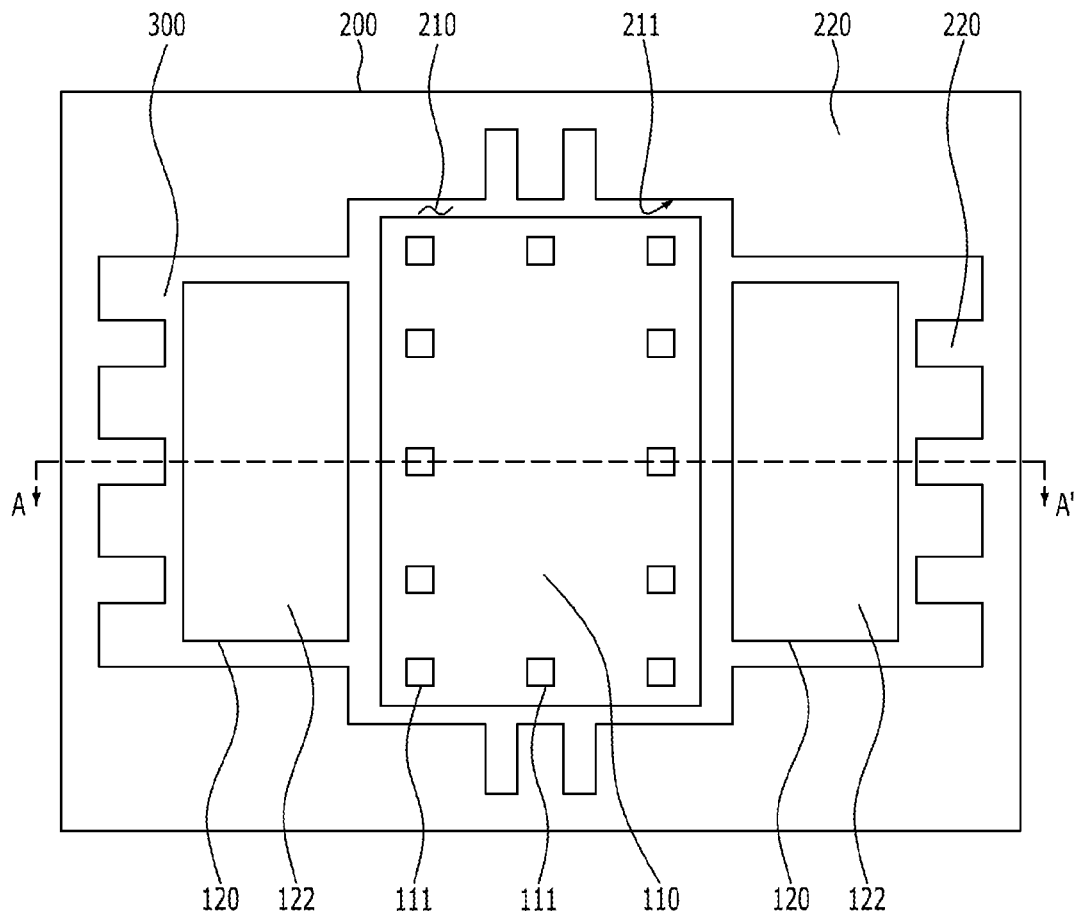
Figure 7B:
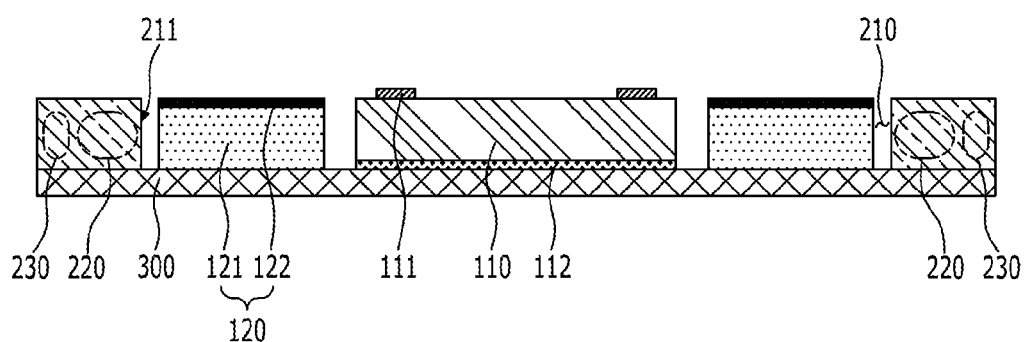

FIGS. 7A and 7B are a view illustrating a step of placing the semiconductor chip 110 and the passive device 120 in the method of manufacturing the semiconductor package 10 including the passive device 120 embedded therein according to an embodiment of the present invention. FIG. 7A is a plan view illustrating the configuration in which the semiconductor chip 110 and the passive device 120 are disposed in the receiving portion 210 in the base substrate 200, and FIG. 7B is a cross-sectional view taken along line A-A' in FIG. 7A.

As illustrated in FIG. 7B, in the mounting step S30 of placing the semiconductor chip 110 and the passive device 120 in which a functional electrode is not formed, a carrier sheet may be adhered to one surface of the base substrate 200, and the semiconductor chip 110 and the passive device 120 may be mounted in the receiving portion 210 formed in the base substrate 200. At this time, the bottom surface of the semiconductor chip 110 and the bottom surface of the passive device 120 may be adhered to the carrier sheet. As illustrated in FIG. 7A, passive devices 120 may be disposed on respective opposite side surfaces of the semiconductor chip 110 so as to be spaced apart from each other by a predetermined interval. The number or arrangement of semiconductor chips 110 and passive devices 120 is not limited to that described herein.

Figure 8A:
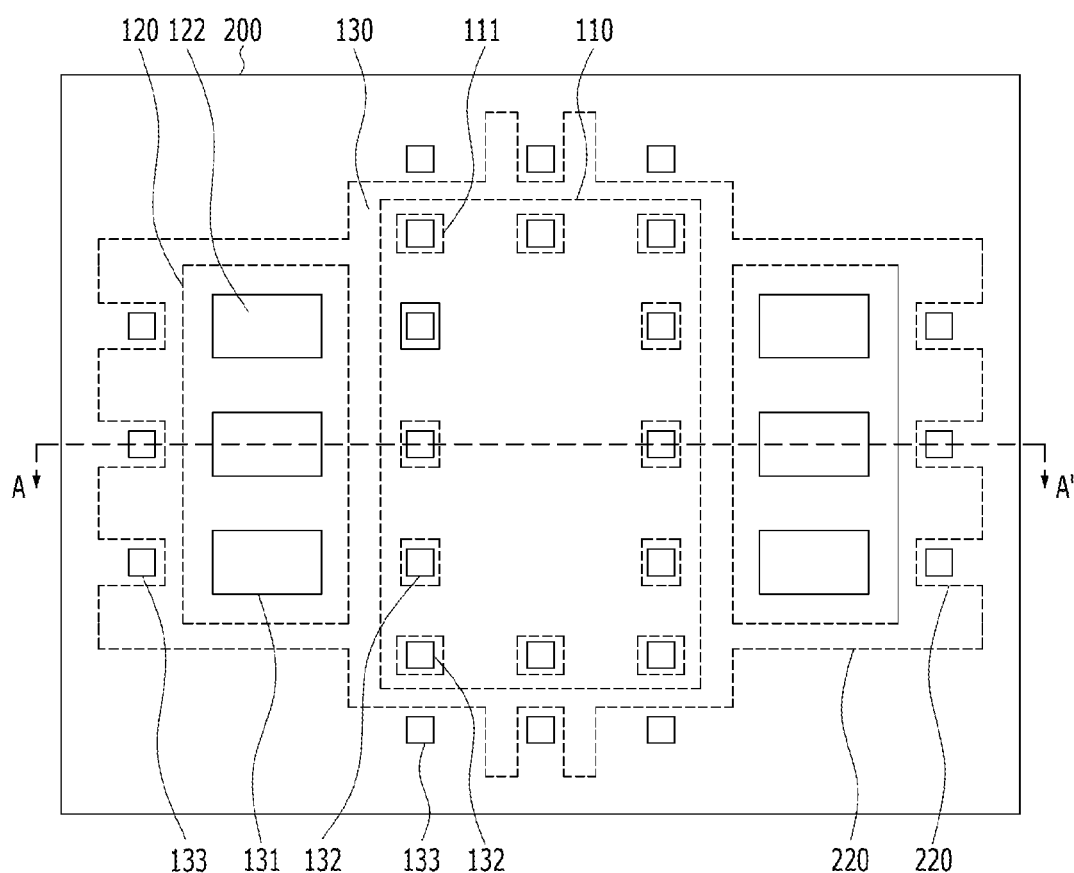
Figure 8B:
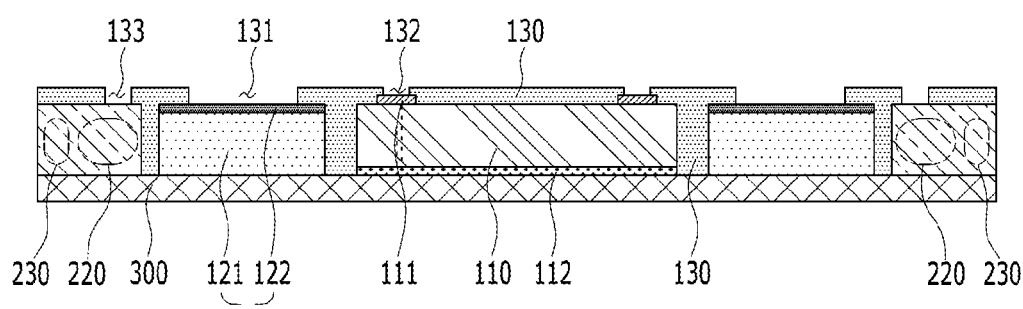

FIGS. 8A and 8B are a view illustrating a step of forming the cover layer 130 and forming an opening in the method of manufacturing the semiconductor package 10 including the passive device 120 embedded therein according to an embodiment of the present invention. FIG. 8A is a plan view illustrating the state in which the cover layer 130 is formed on the semiconductor chip 110 and the passive device 120 and an opening is formed in the cover layer 130, and FIG. 8B is a cross-sectional view taken along line A-A' in FIG. 8A.

As illustrated in FIG. 8A, in the covering step S40, the cover layer 130 may be formed to cover the semiconductor chip 110 and the passive device 120. The cover layer 130 may be formed to include at least one first opening 131 formed therein to expose a region in which a functional electrode is to be formed.

For example, the first opening 131 may be formed to expose the region FA in which an upper electrode of the capacitor is to be formed. Since the electrode pattern 140 is formed in the space exposed by the first opening 131, the shape of the upper electrode of the capacitor may be determined by the shape of the first opening 131, and accordingly the capacitance of the capacitor may be determined.

After the semiconductor chip 110 and the passive device 120 are mounted in the receiving portion 210 in the base substrate 200, the cover layer 130 may be formed to cover the spaces between the semiconductor chip 110, the passive device 120 and the receiving portion 210 and to cover the top surfaces of the semiconductor chip 110, the passive device 120 and the base substrate 200. The cover layer 130 may be formed through a lamination method or the like using a photodefinable lamination material, an organic lamination material, or the like. The cover layer 130 may generally cover the semiconductor chip 110, the passive device 120, and the base substrate 200 to support the same.

In the covering step S40, at least one second opening 132 may be further formed in the cover layer 130 in order to expose a portion of the electrode pad 111 of the semiconductor chip 110, or at least one third opening 133 may be further formed in the cover layer 130 in order to expose a portion of the protruding portion 220.

The second opening 132 may be formed so as to expose at least a portion of the electrode pad 111 of the semiconductor chip 110 that needs to receive or output an electrical signal. The second opening 132 may be formed to correspond to every electrode pad 111 that needs to receive or output an electrical signal. The third opening 133 may be formed so as to expose at least a portion of the protruding portion 220 that is to be formed as a signal transmission segment 151 that needs to receive or output an electrical signal. The third opening 133 may be formed to correspond to every protruding portion 220 that is to be formed as a signal transmission segment 151 that needs to receive or output an electrical signal. A fourth opening 134 may be formed in the region of the cover layer 130, rather than in the region in which the first opening 131 is formed, so as to expose a region for providing necessary electrical contact to the region other than the region in which a functional electrode of the passive device 120 is formed. The first to fourth openings 131 to 134 may be formed in a hole shape by removing a portion of the cover layer 130 through an etching method, a laser drilling method, an exposure and development method, or the like so as to expose a portion of the component covered by the cover layer 130.

Figure 9A:
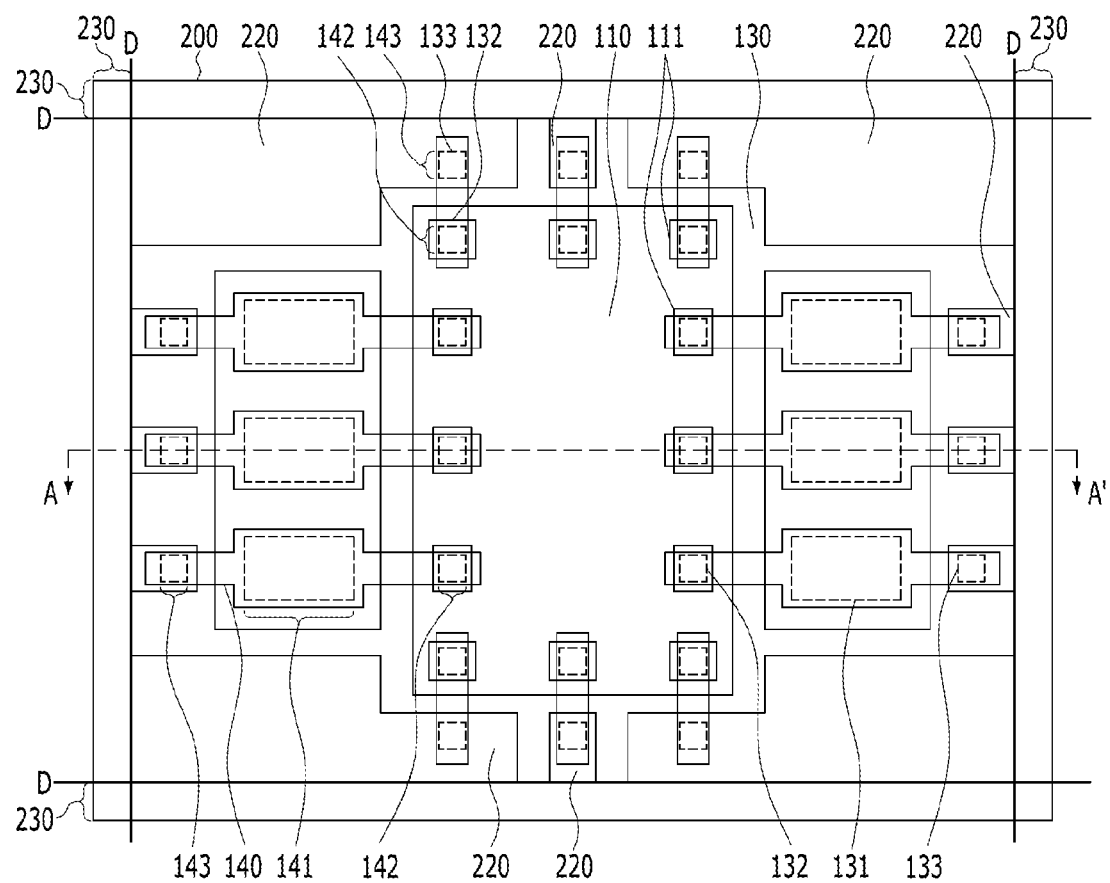
Figure 9B:
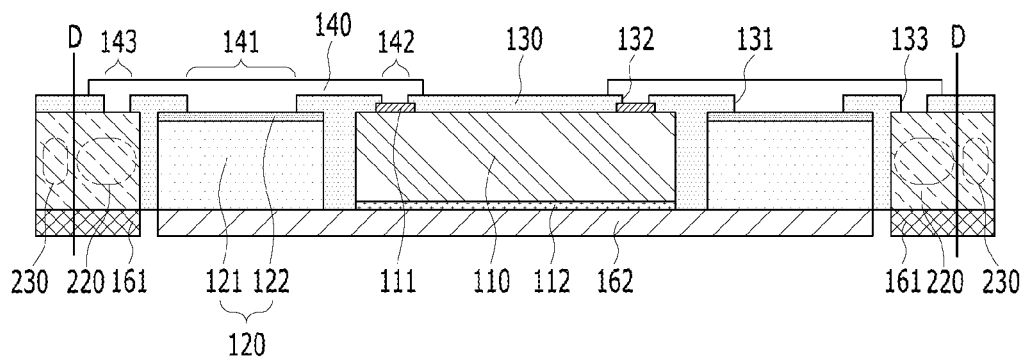

FIGS. 9A and 9B are a view illustrating a step of forming the electrode pattern 140 on the cover layer 130 in the method of manufacturing the semiconductor package 10 including the passive device 120 embedded therein according to an embodiment of the present invention. FIG. 9A is a plan view illustrating the state in which the electrode pattern 140 is formed on the cover layer 130, and FIG. 9B is a cross-sectional view taken along line A-A' in FIG. 9A.

As illustrated in FIGS. 9A and 9B, in the electrode pattern forming step S50, the electrode pattern 140 may be formed of a material having electrical conductivity on the cover layer 130. The electrode pattern 140 may be formed to include a functional electrode portion 141, which is formed in a region in which a functional electrode is to be formed through the first opening 131.

In addition, in the electrode pattern forming step S50, a chip connection portion 142 may be further formed so as to be connected to the electrode pad 111 through the second opening 132, or a segment connection portion 143 may be further formed so as to be connected to the protruding portion 220 through the third opening 133. Alternatively, in the electrode pattern forming step S50, the electrode pattern 140 may be formed so as not to include a functional electrode portion 141, which is formed at a portion that requires electrical contact other than the functional electrode of the passive device 120 through the fourth opening 134 to provide the passive device 120 with electrical contact other than the functional electrode.

In the electrode pattern forming step S50, the electrode pattern 140 may be formed through only one of the first opening 131, the second opening 132, the third opening 133, and the fourth opening 134, depending on the design requirements thereof. Alternatively, the electrode pattern 140 may be formed through at least two of the first opening 131, the second opening 132, the third opening 133, or the fourth opening 134. However, one electrode pattern 140 may not be formed through either the first opening 131 or the fourth opening 134. The electrode pattern 140 may be formed through a known method such as pattern plating or etching.

After the electrode pattern forming step S50, a lower pad forming step S55 of forming a first lower pad 161 or a second lower pad 162 using a material having electrical conductivity may be performed. The lower pad forming step S55 may be performed simultaneously with the electrode pattern forming step S50.

The carrier sheet 300 may be removed after the covering step S40, and subsequently the electrode pattern forming step S50 and the lower pad forming step S55 may be performed at the same time. Alternatively, the carrier sheet 300 may be removed after the electrode pattern forming step S50, and subsequently the lower pad forming step S55 may be performed.

In addition, the method of manufacturing the semiconductor package 10 including the passive device 120 embedded therein according to an embodiment of the present invention may further include, after the electrode pattern forming step S50, a cutting step S60 of cutting the portion at which the protruding portion 220 and the base substrate 200 are connected to each other to form a signal transmission segment 151, which is electrically insulated from the base substrate 200.

In the cutting step S60, when the portion of the base substrate 200 at which the protruding portion 220 and the support portion 230 are connected to each other is cut along a cutting line D, one protruding portion 220 and another protruding portion 220, which are spaced apart from each other and are connected to each other via the support portion 230, may be separated from the support portion 230, and each protruding portion 220 becomes a signal transmission segment 151 (refer to "151" in FIG. 1). When the cutting step is completed, the protruding portion 220 becomes a signal transmission segment 151, which is physically and electrically separated from another one, and thus the signal transmission segment 151 may be used as an electrical signal transmission path.

The cutting line D may be determined on the basis of the portion at which the protruding portion 220 and the support portion 230 are connected to each other. When the cutting step S60 is completed, the semiconductor package 10 including the passive device 120 embedded therein according to an embodiment of the present invention may be obtained as illustrated in FIGS. 1 and 2.

As described above, in the method of manufacturing the semiconductor package 10 including the passive device 120 embedded therein according to an embodiment of the present invention, since a functional electrode is not formed in the process of preparing the passive device 120, the process of forming a functional electrode may be eliminated. Further, when the electrode pattern 140 is formed in the process of packaging the passive device 120 without a functional electrode together with the semiconductor chip 110, a portion of the electrode pattern 140 is formed in a region in which a functional electrode of the passive device 120 is to be formed, and functions as a functional electrode. As such, it is possible to form both the electrode pattern 140 and the functional electrode in a single process. Therefore, manufacturing costs may be reduced. Further, it is possible to determine the performance of the passive device 120 by determining the shape of the functional electrode in the packaging process. Therefore, design freedom may be increased.

According to the method of manufacturing the semiconductor package 10 including the passive device 120 embedded therein according to an embodiment of the present invention, the receiving portion 210 having a serpentine-shaped circumference is formed in the base substrate 200, the semiconductor chip 110 and the passive device 120 are mounted in the receiving portion 210, the cover layer 130 is formed, the electrode pattern 140 is formed, and finally the cutting step is performed to separate the protruding portion 220 from the base substrate 200, thereby forming the signal transmission segment 151. Therefore, compared with a conventional manufacturing method, in which a signal transmission segment is disposed near a semiconductor chip and a passive device in the state of being separated therefrom from the beginning, it is possible to form the signal transmission segment 151 at an accurate position, thereby lowering the defect rate and facilitating the manufacturing process.

As is apparent from the above description, according to an embodiment of the present invention, a portion of an electrode pattern provided for electrical connection in a semiconductor package is used as a functional electrode of a passive device embedded in the semiconductor package. Thus, it is possible to eliminate a step of manufacturing a functional electrode in the process of manufacturing the passive device, thereby reducing the cost of manufacturing the passive device.

In addition, according to an embodiment of the present invention, since wire bonding is not used, no shocks are applied to the passive device. Thus, even when the passive device is formed of any of various materials, the passive device is less likely to be damaged, thus lowering the defect rate.

Although the present invention has been described in detail with reference to specific embodiments, those embodiments are provided only for illustrative purposes. Therefore, the present invention is not limited to those embodiments, but rather those skilled in the art will appreciate that various modifications, additions and substitutions are possible, without departing from the scope and spirit of the invention as disclosed in the accompanying claims.

Further, simple changes and modifications of the present invention are to be appreciated as being included in the scope and spirit of the invention, and the protection scope of the present invention will be defined by the accompanying claims.

What is claimed is:

1. A semiconductor package comprising:
   a semiconductor chip comprising an electrode pad formed on a top surface thereof;
   a passive device embedded in the semiconductor package, wherein a functional electrode portion is formed thereon;
   a cover layer covering the semiconductor chip and the passive device and comprising at least one first opening formed therein to expose a part of the passive device;
   at least one electrode pattern formed on the cover layer to transmit an electrical signal; and
   at least one signal transmission segment disposed so as to be spaced apart from a side surface of the semiconductor chip or the passive device in order to transmit an electrical signal from an upper side of the semiconductor package to a lower side thereof,
   wherein the functional electrode portion is a portion of the electrode pattern, is formed on the passive device through the first opening, and is a component that is required in order for the passive device to perform the function of the passive device,
   wherein the passive device performs a function of the passive device by forming the functional electrode portion,
   wherein the cover layer covers the signal transmission segment, and further comprises at least one third opening formed therein to expose the signal transmission segment, and
   wherein the electrode pattern further comprises at least one segment connection portion connected to the signal transmission segment through the third opening.

2. The semiconductor package according to claim 1, further comprising:
   a first lower pad formed of a material having electrical conductivity on a bottom surface of the signal transmission segment so as to be in contact with an external circuit; and
   a second lower pad formed of a material having electrical conductivity on a bottom surface of the semiconductor chip or a bottom surface of the passive device so as to be in contact with an external ground.

3. The semiconductor package according to claim 1, wherein the passive device comprises one of a capacitor, an inductor, and a resistor, and
   wherein the functional electrode is an upper electrode or a lower electrode of the capacitor, a part of a spiral pattern of the inductor, or a part of a resistance pattern of the resistor.

4. The semiconductor package according to claim 1, wherein the cover layer further comprises at least one second opening formed therein to expose a portion of the electrode pad of the semiconductor chip, and
   wherein the electrode pattern further comprises a chip connection portion connected to the electrode pad through the second opening.

5. The semiconductor package according to claim 1, wherein the passive device is a capacitor comprising:
   a body portion having electrical conductivity; and an insulating layer formed of a material having electrical insulativity on at least a portion of a top surface of the body portion, wherein the capacitor has no upper electrode on the insulating layer, wherein the first opening in the cover layer is formed to expose a region in which the upper electrode is to be formed, and wherein the functional electrode portion of the electrode pattern is formed in a region in which the upper electrode is to be formed, and functions as the upper electrode of the capacitor.

6. The semiconductor package according to claim 1, wherein the cover layer further comprises a fourth opening formed therein to expose a portion of a top surface of the body portion on which the insulating layer is not formed, and wherein the semiconductor package further comprises an electrode pattern comprising a sub-electrode portion connected to the body portion through the fourth opening to function as a lower electrode of the passive device, the electrode pattern being not provided with the functional electrode portion.

7. A semiconductor package comprising:

a semiconductor chip comprising an electrode pad formed on a top surface thereof;

a passive device embedded in the semiconductor package, a cover layer covering the semiconductor chip and the passive device and comprising at least one first opening formed therein to expose a part of the passive device; and at least one electrode pattern formed on the cover layer to transmit an electrical signal, and having a functional electrode portion, the passive device including:

a body portion having electrical conductivity; and an insulating layer formed of a material having electrical insulativity on at least a portion of a top surface of the body portion, wherein the capacitor has no upper electrode on the insulating layer, wherein the first opening in the cover layer is formed to expose a region in which the upper electrode is to be formed, wherein the functional electrode portion is a portion of the electrode pattern, is formed in a region in which the upper electrode is to be formed on the passive device through the first opening, and functions as the upper electrode of the capacitor, and wherein the passive device performs a function of the passive device by forming the functional electrode portion.

8. The semiconductor package according to claim 7, wherein the cover layer further comprises a fourth opening formed therein to expose a portion of a top surface of the body portion on which the insulating layer is not formed, and wherein the semiconductor package further comprises an electrode pattern comprising a sub-electrode portion connected to the body portion through the fourth opening to function as a lower electrode of the passive device, the electrode pattern being not provided with the functional electrode portion.

* * * * *